Nov. 3, 1970 E. J. METS ET AL 3,537,889

LOW TEMPERATURE FORMATION OF OXIDE LAYERS ON
SILICON ELEMENTS OF SEMICONDUCTOR DEVICES

Filed Oct. 31, 1968

INVENTORS:
EDWIN J. METS,
RALPH I. JURGENSEN,

BY Carl O. Thomas

THEIR ATTORNEY.

United States Patent Office 3,537,889

Patented Nov. 3, 1970

3,537,889

LOW TEMPERATURE FORMATION OF OXIDE LAYERS ON SILICON ELEMENTS OF SEMICONDUCTOR DEVICES

Edwin J. Mets and Ralph I. Jurgensen, Skaneateles, N.Y., assignors to General Electric Company, a corporation of New York Filed Oct. 31, 1968, Ser. No. 772,345
Int. Cl. H01b *1/02*; C23c *13/04*
U.S. Cl. 117—201 8 Claims

ABSTRACT OF THE DISCLOSURE

A saturated solution of a thermally decomposable compound of a glass forming metal, such as a lead or arsenic salt or oxide, is prepared in water. A porous ceramic fixture which is designed to contain a silicon wafer during a subsequent glass-forming step is immersed in the solution until saturated. The fixture is removed and dried. A silicon element is placed in the fixture, and the fixture is inserted into a preheated furnace having a flowing oxygen atmosphere. The furnace temperature permits oxidation of all exposed element surfaces, and the thermally liberated metal migrates to the silicon element surface to accelerate oxidation. A thick, uniform glass surface layer may be formed. A contact element may be soldered to the silicon element before placement in the fixture, or a portion of the glass may be etched from the surface to permit subsequent attachment of a contact element.

BACKGROUND OF THE INVENTION

This invention relates generally to processes for manufacturing semiconductor products and, more specifically, to a method for oxidizing the exposed surface of a silicon semiconductor element.

Experimenters have long known that even the purest silicon element can be diffused with unwanted impurities upon a subsequent heating thereof if impurities have been left on the silicon element surface as, for example, by a chemical etchant, or impurities are allowed to migrate to the silicon element surface, as by exposure of the silicon element to an impurity containing atmosphere. Such unwanted impurities generally are in the form of a metal, such as iron, nickel, or copper. In the art, these metals are known as fast diffusers, for upon heating of the silicon element, they may diffuse through the element in less than a minute, thus changing the characteristic of any doped region therein from that originally formed. Further, if a junction of opposite conductivity type regions has been established within the element, the fast diffusers generally migrate to dislocations in the crystal structure at or near the junction to form an effective short across the junction.

One attempt in the prior art to meet this problem has been the formation of an oxide, preferably a glass, surface layer on the silicon element. The oxide, if properly formed, effectively getters impurities from the silicon surface and will act as a barrier to the diffusion of more unwanted impurities to the surface. Since silicon readily oxidizes upon contact with oxygen, it has heretofore been proposed to protect the surface of silicon elements merely by exposing the silicon element to an oxygen atmosphere. The oxide layers so formed have lacked the thickness and uniformity required to fully protect the semiconductor elements. More protective surface oxide coatings have been obtained by coating the exposed surfaces of silicon elements with glass. However, the manipulative process steps in achieving a uniform glass coating on a silicon semiconductor element are considerably more complex than the oxidation of silicon to form a protective coating. Further, the known techniques of applying glass to silicon element surfaces are not generally applicable to all semiconductor element geometries.

SUMMARY OF THE INVENTION

It is, therefore, a specific object of this invention to provide a process for forming a uniform, relatively impervious oxide layer on a silicon element which approaches conventional surface oxidation processes in manipulative simplicity, which effectively getters impurities from the silicon interior and surface, and which protects the silicon element against further contamination by the ambient.

This and other objects of our invention is accomplished in one aspect by providing a process for the surface oxidation of a silicon semiconductor element comprising impregnating a porous ceramic fixture defining at least one cavity with a thermally decomposable compound of a metal capable of accelerating the oxidation of silicon. The silicon semiconductor element is placed within the cavity, and the fixture is heated to a temperature sufficient to allow migration of the metal to an exposed surface of the semiconductor element. Oxygen is also allowed to contact the surface of the semiconductor element.

BRIEF DESCRIPTION OF THE DRAWINGS

For a more complete understanding of the invention together with further objects and advantages thereof, reference should be made to the following detailed description taken in conjunction with the accompanying drawings, in which.

DESCRIPTION OF THE PREFERRED EMBODIMENT

Figure 1:
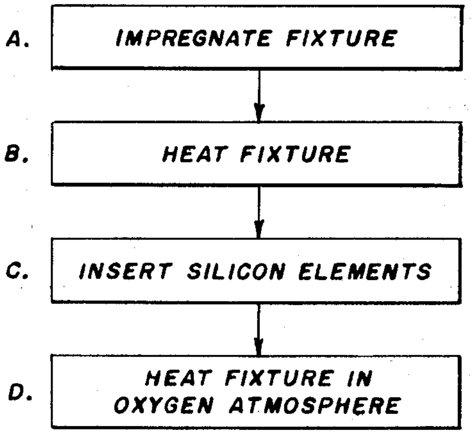
FIG. 1 is a flow diagram of the process of this invention.
Figure 2:
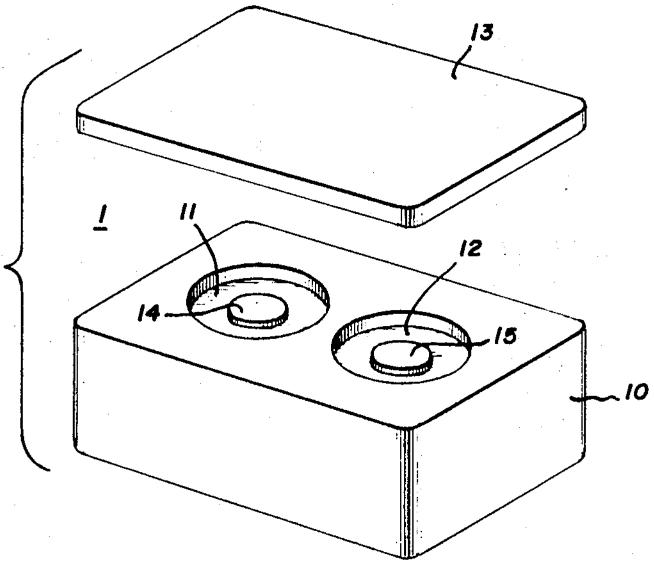
FIG. 2 is an isometric view of a ceramic fixture with silicon elements in place.

Referring to FIG. 1, Step A of the process is to impregnate a porous ceramic fixture 1, illustrated in FIG. 2, with a thermally decomposable compound of a metal capable of accelerating the oxidation of silicon. We have discovered that metals such as lead and arsenic which together with silicon and oxygen are capable of forming glass compositions also have the property of accelerating oxidation of silicon in an oxygen containing atmosphere. By impregnating a porous ceramic fixture surrounding a silicon semiconductor element with a thermally decomposable compound of such a metal, the metal may be conveniently stored in close proximity to the silicon element and may be liberated by heating in the course of forming an oxide layer on the surface of the silicon element.

A wide variety of suitable thermally decomposable metal compounds are available to choose from, including oxides, such as $PbO$, $Pb_2O_3$, $Pb_3O_4$, $As_2O_3$, $As_2O_5$, etc., and salts, such as lead and arsenic halides, nitrates, acetates, etc. The specific choice of a compound to be employed may be influenced by the thermal decomposition temperature and the thickness of the oxide layer desired.

The fixture may be formed of any porous ceramic, alumina being particularly suitable. An exemplary fixture construction is shown in FIG. 2. The fixture 1 comprises a block 10 of porous ceramic in which two cavities 11 and 12 have been formed. A mating porous ceramic cover 13 is provided to overlie the recesses.

The metal compound may be introduced into the pores of the fixture by a number of techniques. According to a preferred approach the metal compound is dissolved in water until a saturated solution is formed. The fixture is then immersed in the solution and soaked until the metal compound has penetrated the pores. It is recognized that the loading of the metal compound may be increased by varying the temperature of the solution to increase the solubility of the metal compound. Impregnation of the pores may be aided exposing the solution to a low ambient pressure while the fixture is immersed, as in vacuum impregnating. Instead of employing water as the solvent for the solution, it is appreciated that other solvents may be substituted, depending on the characteristics of the metal compound chosen. Water is a preferred solvent for most applications, since it is readily available at low cost and since most metal salts can be dissolved to some extent therein. The fixture will readily store considerably more metal compound than is required in forming an oxide layer, so limited water solubility of a metal compound ordinarily poses no difficulty.

After the fixture is impregnated with the metal compound, it is preferably preheated in a furnace, as indicated by Step B prior to introducing the silicon elements to be treated, Step C. The initial heating step may be advantageously used to dry out the fixture where the metal compound has been introduced in a solvent carrier. Also, the preheating may be used to simplify calculation of the time the silicon elements are maintained at a given temperature. Preheating is preferably conducted only for the time necessary to bring the fixture to the oxide forming temperature desired. In view of the large excess metal capacity of the fixture loss of the impregnated metal during preheating is negligible.

In FIG. 2 the silicon elements 14 and 15 are shown positioned in the cavities 11 and 12, respectively. The silicon elements may take the form of any conventional semiconductor element for a semiconductor device. Also, the silicon element may be a relatively large wafer of silicon intended for later sub-division to form a plurality of discrete elements, as is well appreciated in the art. The semiconductor element may be of P-type conductivity, N-type conductivity, intrinsic conductivity, or some combination of these—i.e. the silicon element may contain one or more junctures and/or junctions, as is typical in rectifier and transistor elements. Where the semiconductor element contains junctions and is intended to be later sub-divided, the element is preferably formed with surface grooves along the intended lines of cleavage so that the oxide layer will be formed over the entire junction periphery of each discrete element after sub-division.

After the silicon elements are inserted in the cavities, the cover 13 of the fixture is preferably placed to overlie the cavities, and the fixture is heated in a furnace having an oxygen atmosphere to the thermal decomposition temperature of the impregnated metal compound, typically at least 350° C. At this temperature the silicon at the surface of the elements reacts readily with oxygen to form a thin oxide layer. A portion of the metal liberated by thermal decomposition migrates to the surface of the semiconductor element. The metal reacts with oxygen at the surface so that a complex oxide of the metal and silicon is formed. The presence of the metal on the surface of the silicon element accelerates oxidation, so that an oxide coating of greater thickness is obtained than could be obtained without the metal being present. Initially the metal, silicon, and oxygen interact to form an oxide coating similar in appearance to the grown silicon oxide coatings formed by conventional techniques. Soon after oxide formation, however, the oxide layer begins to exhibit glass characteristics so that after a few minutes a distinct glass layer is present on all exposed surfaces of the semiconductor element. As employed herein, the term "oxide layer" is used to describe both the initial grown oxide and subsequently formed glassy layer, since in either form the oxide coating is useful in protecting the silicon element against unwanted impurities. It is generally preferred to carry formation of the oxide layer to the glass stage, since it is recognized that the glass layer is thicker than the initially formed oxide and is more impenetrable by impurities.

Since the fixture is porous and since the cover is loosely fitted to the fixture, sufficient oxygen to support the oxide formation is provided by diffusion of oxygen. To allow oxide formation at a somewhat more rapid rate and to insure against diffusion of impurities it is preferred that oxygen be continuously flowed through the furnace in which the fixture is located during heating. The oxygen may be in a pure form or may be diluted with any other gas which is inert to the oxidation reaction, such as argon, for example. If the cover is left off the fixture, oxygen access will be improved, but the formation of oxide on the exposed upper surface of the silicon elements will be retarded and no uniform glassy layer will be obtainable on the upper surfaces.

Figure 3:
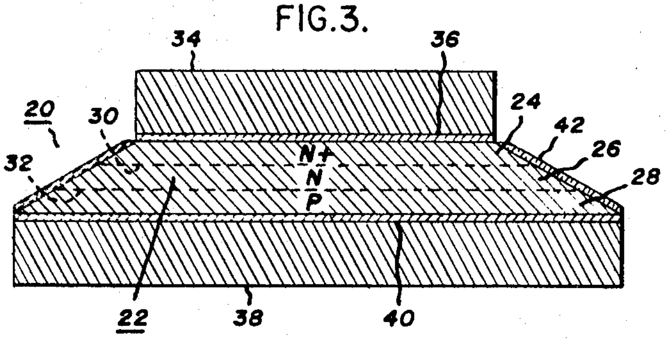
FIG. 3 is a vertical section of a silicon element having electrical contacts attached and an oxide layer on the remaining surfaces.

An exemplary preferred product of the invention is illustrated in FIG. 3. The sub-assembly 20 is comprised of a silicon semiconductor element 22 having parallel regions 24, 26, and 28. The region 24 is of P-type conductivity and is heavily doped as compared with region 26, which is also of P-type conductivity. The region 26 may closely approach intrinsic conductivity. A juncture 30 is formed between the P-type conductivity regions 24 and 26 while a junction 32 is formed between the P-type conductivity region 26 and the N-type conductivity region 28. The periphery of the silicon element is beveled to improve the reverse blocking voltage characteristics of the element.

Before the silicon element is placed in a fixture for oxide formation according to the invention, an upper electrical contact 34 is joined to the region 24 by a solder layer 36 while a lower electrical contact 38 is joined to the region 28 by a solder layer 40. In a typical embodiment the electrical contacts may be tungsten or molybdenum back up plates.

Since it is desired to form an oxide layer on the exposed surfaces of the silicon element not covered by the contacts and solder layers, the metal compound to be thermally decomposed in the fixture is chosen to allow the metal to become available at a temperature below the melting point of the solder or any eutectic it might form with silicon. For example, assuming a widely used solder, such as aluminum solder, the metal compound is chosen to decompose below the aluminum-silicon eutectic temperature of 577° C. Given this maximum permissible temperature level lead halide, such as $PbCl_2$, may be conveniently employed. On the other hand, if a solder having a lower melting temperature is employed, such as a gold-silicon alloy solder, a metal compound having a thermal decomposition temperature below the melting point of this solder, such as arsenic oxide ($As_2O_3$) is preferably substituted. It is, of course, recognized that it is not essential that a metal compound be chosen that is capable of decomposing below the melting point of the solder layer. For example, where only the lower contact is present, the contact may be placed in a suitable refractory receptacle so that the silicon element may be floated on the molten solder layer during formation of the oxide layer.

The peripheral oxide layer 42 may take the form of a dense, uniform layer of glassy oxide, which is an impenetrable to unwanted impurities as glasses formed entirely of externally supplied ingredients. The formation process offers the distinct advantage that the glass layer formed covers only the exposed silicon element surfaces, so that no subseqeunt etching step is required in order to achieve electrical contact to the connectors; hence, the opportunity for damaging the oxide layer and/or introducing unwanted impurities is minimized and the process of sub-assembly formation is maintained quite simple as compared to conventional approaches in which contacts are attached after glass application.

The process has the advantage of being applicable generally to conventional silicon element geometries. While the fixture illustrated is provided with only two cavities, it is appreciated that a fixture having a large number of cavities or only one may be used instead. With repeated use of the fixture there is no necessity that the fixture be reimpregnated each time with metal compound, since a large excess of metal compound can be introduced into the fixture with a single impregnation step.

The following are illustrative examples of the teachings of this invention:

EXAMPLE 1

Two silicon wafers about one inch in diameter and about 7 mils thick were cleaned, one by dipping in a solution of hydrofluoric acid and the other by boiling in nitric acid. Simultaneously, a saturated solution of lead chloride, $PbCl_2$, was prepared and a porous alumina fixture, similar to fixture 1 shown in FIG. 2, was immersed therein. The fixture was removed and blotted dry. The silicon wafers were placed in cavities in the fixture approximately one inch in diameter and 125 mils in depth and the fixture cover 13 installed.

A quartz furnace was preheated to 550° C. The wafers and fixture were inserted into the furnace and allowed to remain for sixty minutes. No induced oxygen flow was established before or during glass formation, although the fixture was exposed to ambient air.

Both wafers showed a very uniform glassy oxide layer on all surfaces having a thickness in the range of from 5 to 10 microns. Since the wafer cleaned with hydrofluoric acid was initially free of surface oxides while the wafer cleaned with nitric acid retained a thin surface oxide due to oxidation by the acid, it was established that the presence or absence of an initial surface oxide was immaterial.

EXAMPLE 2

The experimental procedure of Example 1 was followed, except that two wafers were cleaned by boiling in nitric acid. The surface oxidation step was carried out for one hour at 600° C. with dry oxygen flowing at the rate of 1 cubic foot per hour at STP. Upon examination, it was found that a very uniform glassy oxide layer was formed on all wafer surfaces.

EXAMPLE 3

The experimental procedure of Example 1 was followed, except that oxidation was conducted for twenty minutes at 600° C. Upon examination both wafers exhibited a uniform glassy oxide layer on all surfaces.

EXAMPLE 4

A silicon element, similar to semiconductor element 22 shown in FIG. 3, was provided with upper and lower tungsten electrical contacts 10 and 20 mils in thickness respectively using aluminum as a solder for attachment. The silicon element was 10 mils thick, with P+, P, N regions being 1.5–2.0, 6–7, and 1.5–2.0 mils thick, respectively. The diameter of the surface adjacent the P+ type conductivity region was 125 and 185 adjacent the N type conductivity region. The semiconductor element was of circular configuration with the peripheral edge between the solder layers being beveled.

The semiconductor sub-assembly was preliminarily cleaned with an etchant. At the same time a fixture similar to fixture 1 of FIG. 2 having two cavities each one-half inch in diameter and 125 mils in depth was immersed in a saturated solution of lead chloride, $PbCl_2$. After impregnation the fixture was heated to 545° C., and the semiconductor sub-assembly thereafter placed within one cavity and the closure positioned over the cavity. The fixture with the semiconductor assembly inside was placed in a furnace having an oxygen flow therethrough of one cubic foot per hour at STP and a temperature of 545° C. for a period of 30 minutes.

The resulting semiconductor sub-assembly was similar in appearance to the sub-assembly of FIG. 3. A uniform glassy oxide layer was selectively formed on the exposed surfaces of the silicon element and did not overlie the electrical connectors. The layer was in the thickness range of from 5 to 10 microns. No pin holes, cracks, or any other irregularity was observed in the oxide layer. The subassembly formed was tested before and after formation of the oxidation layer formation and in each instance found to withstand a reverse blocking voltage of 1200 volts. As controls, identical silicon semiconductor sub-assemblies were subjected to the same furnace conditions, except that they were not associated with an impregnated fixture. While the subassemblies initially withstood 1200 volts reverse blocking voltage, after coming from the furnace, and cooling the subassemblies were destroyed in attempting to again apply the 1200 volts reverse blocking voltage.

EXAMPLE 5

The procedure of Example 4 was repeated, except that the fixture was soaked in a saturated solution of arsenic oxide ($AS_2O_3$), gold-silicon alloy was used to solder the electrical contacts to the silicon element, and the furnace temperature was reduced to 375° C. Results similar to those of Example 4 were obtained.

While this invention has been described with reference to certain preferred embodiments, it is appreciated that numerous variations will readily occur to those skilled in the art. It is accordingly intended that the scope of this invention be determined with reference to the following claims.

What we claim as new and desire to secure by Letters Patent of the United States is:

1. A process for the surface oxidation of a silicon semiconductor element comprising impregnating a porous ceramic fixture defining at least one cavity with a thermally decomposable compound of a metal capable of accelerating the oxidation of silicon, placing a silicon semiconductor element within the cavity, heating the fixture to a temperature sufficient to allow migration of the metal to an exposed surface of the semiconductor element, and allowing oxygen to contact the surface of the semiconductor element.

2. A process for the surface oxidation of a silicon semiconductor element according to claim 1 in which the semiconductor element contains at least one junction between opposed major surfaces, contact means are associated with the opposed major surfaces, and the fixture is heated to a migration temperature below the melting temperature of the contact means.

3. A process for the surface oxidation of a silicon semiconductor element according to claim 1 in which the metal is lead and the lead is impregnated into the ceramic fixture in the form of a water soluble lead compound.

4. A process for the surface oxidation of a silicon semiconduct element according to claim 3 in which the lead is introduced into the fixture as a lead halide.

5. A process for the surface oxidation of a silicon semiconductor element according to claim 1 in which the metal is arsenic and is impregnated into the ceramic fixture in the form of a water soluble arsenic compound.

6. A process for the surface oxidation of a silicon semiconductor element according to claim 1 in which an oxygen stream is directed to the semiconductor surface to be oxidized.

7. A process for the surface oxidation of a silicon semiconductor element comprising attaching a contact element resistant to oxidation to a silicon semiconductor element with an aluminum solder layer, impregnating a porous ceramic fixture defining at least one cavity with an aqueous solution of a lead compound thermally decomposable below the melting temperature of the aluinmum solder, placing the silicon semiconductor element within the cavity, allowing oxygen to contact the semiconductor element, and heating the fixture to a temperature between the thermal decomposition temperature of the lead compound and the eutectic melting temperature of aluminum-silicon alloy to allow migration of the lead to an exposed surface of the semiconductor element and thereby accelerate oxidation of the silicon surface.

8. A process for the surface oxidation of a silicon semiconductor element comprising attaching a contact element resistant to oxidation to a silicon semiconductor element with a gold-silicon alloy solder, impregnating a porous ceramic fixture defining at least one cavity with an aqueous solution of an arsenic compound thermally decomposable below the melting temperature of the gold-silicon alloy solder, placing the silicon semiconductor element within the cavity, allowing oxygen to contact an exposed surface portion of the semiconductor element, and heating the fixture to a temperature between the thermal decomposition temperature of the arsenic compound and the melting temperature of the gold-silicon alloy solder layer to allow migration of the arsenic to an exposed surface of the semiconductor element and thereby accelerate oxidation of the silicon surface.

References Cited

UNITED STATES PATENTS

| | | | |
|---|---|---|---|
| 3,377,200 | 4/1968 | Chamberlin et al. | 117—201 |
| 3,442,700 | 5/1969 | Yoshioka et al. | 117—201 |
| 3,447,958 | 6/1969 | Okutsu et al. | 117—201 |

WILLIAM L. JARVIS, Primary Examiner

U.S. Cl. X.R.

117—106, 120